United States Patent
Yang et al.

(10) Patent No.: US 10,886,138 B2
(45) Date of Patent: Jan. 5, 2021

(54) SUBSTRATE PROCESSING METHOD AND SUBSTRATE PROCESSING APPARATUS

(71) Applicant: Tokyo Electron Limited, Tokyo (JP)

(72) Inventors: Timothy Tianshyun Yang, Miyagi (JP); Shinya Morikita, Miyagi (JP); Kiyohito Ito, Miyagi (JP); Michiko Nakaya, Miyagi (JP); Masanobu Honda, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 16/416,424

(22) Filed: May 20, 2019

(65) Prior Publication Data

US 2019/0355588 A1   Nov. 21, 2019

(30) Foreign Application Priority Data

May 21, 2018 (JP) .................................. 2018-096952

(51) Int. Cl.
*H01L 21/311* (2006.01)
*H01L 21/02* (2006.01)

(52) U.S. Cl.
CPC .. *H01L 21/31116* (2013.01); *H01L 21/02164* (2013.01); *H01L 21/31138* (2013.01); *H01L 21/31144* (2013.01)

(58) Field of Classification Search
CPC ......... H01L 21/31116; H01L 21/31144; H01L 21/31138; H01L 21/02164; H01L 21/0212; H01L 21/0228; H01L 21/02274; H01L 21/02211; H01L 21/0337; H01L 21/32139; H01L 21/0273; H01L 21/67253; H01L 21/0332; H01L 21/0338
See application file for complete search history.

(56) References Cited

FOREIGN PATENT DOCUMENTS

| JP | 2009-099983 A | 5/2009 |
|---|---|---|
| JP | 2012-178378 A | 9/2012 |

*Primary Examiner* — Nadine G Norton
*Assistant Examiner* — Mahmoud Dahimene
(74) *Attorney, Agent, or Firm* — Pearne & Gordon LLP

(57) ABSTRACT

An etching shape can be suppressed from having non-uniform pattern. A substrate processing method includes burying an organic film in a recess surrounded by a silicon-containing film formed on a sidewall of a pattern of photoresist on a target film; and etching or sputtering the organic film and the silicon-containing film under a condition in which a selectivity thereof is about 1:1.

10 Claims, 7 Drawing Sheets

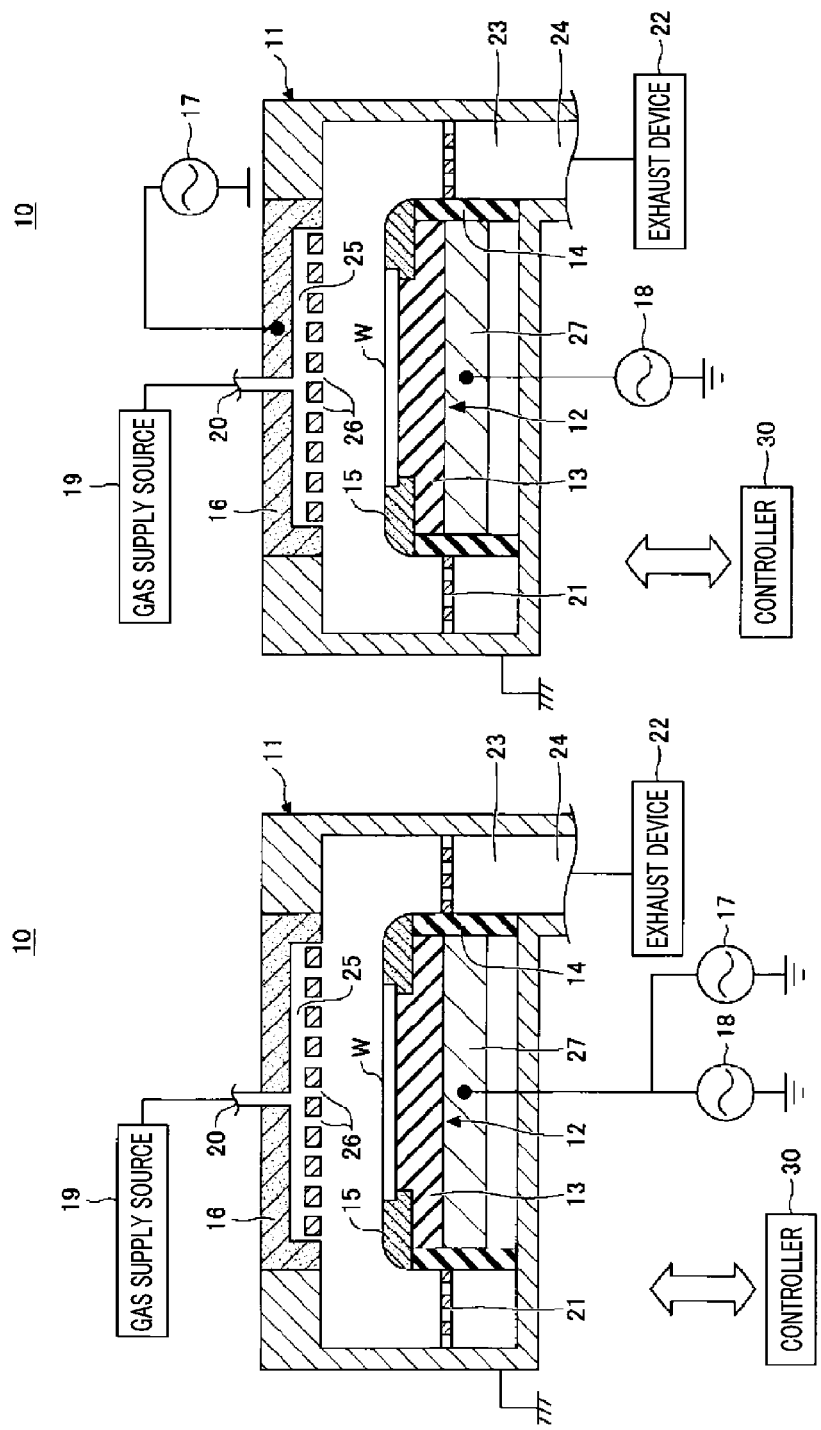

| TEMPERATURE CONDITION | −50°C | −40°C | −30°C | −20°C | −10°C |
|---|---|---|---|---|---|
| FIG. 5A — 100mT $C_4F_6$ 300 sccm | OK | — | OK | NG (VOID PRESENCE) | NG (VOID PRESENCE) |
| FIG. 5B — 50mT IPA ($C_3H_8O$) 75 sccm | OK | OK | NG (VOID PRESENCE) | — | NG (VOID PRESENCE) |
| FIG. 5C — 50mT $C_4F_6$ 300 sccm | OK | — | OK | OK | NG (VOID PRESENCE) |
| FIG. 5D — 50mT $C_4F_6$ 125 sccm | — | — | OK | NG (VOID PRESENCE) | NG (VOID PRESENCE) |

# SUBSTRATE PROCESSING METHOD AND SUBSTRATE PROCESSING APPARATUS

CROSS-REFERENCE TO RELATED APPLICATION

This application claims the benefit of Japanese Patent Application No. 2018-096952 filed on May 21, 2018, the entire disclosures of which are incorporated herein by reference.

TECHNICAL FIELD

The various aspects and embodiments described herein pertain generally to a substrate processing method and a substrate processing apparatus.

BACKGROUND

In a photolithography process, various techniques are being developed to cope with miniaturization of patterns to be formed. Proposed as one of these techniques is self-aligned double patterning such as SADP (Self-Aligned Double Patterning) of reducing a pitch of a resist pattern to ½ or SAQP (Self-Aligned Quadruple Patterning) of reducing the pitch of the resist pattern to ¼ (see, for example, Patent Documents 1 and 2).

Further, there is also proposed using SWT (Side Wall Transfer) of forming a mask on both sides of a sidewall of a single resist pattern while using a $SiO_2$ film, a $Si_3N_4$ film, or the like as a sacrificial film. By using this technique, patterning can be performed at a smaller pitch than that of a resist pattern formed by exposing and developing photoresist.

Patent Document 1: Japanese Patent Laid-open Publication No. 2009-099983

Patent Document 2: Japanese Patent Laid-open Publication No. 2012-178378

However, a pattern of the $SiO_2$ film left on the sidewall of the resist pattern has a so-called "claw shape" (with one side of an upper end thereof gently curved) whose surface is not flattened. Thus, if a target film is etched by using the pattern of the $SiO_2$ film as a mask, the etching shape may have a so-called "non-uniform pattern". Here, the term "non-uniform pattern" refers to a pattern shape in which a widely etched portion and a narrowly etched portion are alternately arranged.

SUMMARY

In view of the foregoing, exemplary embodiments provide a technique capable of suppressing an etching shape from having non-uniform pattern.

In one exemplary embodiment, a substrate processing method includes burying an organic film in a recess surrounded by a silicon-containing film formed on a sidewall of a pattern of photoresist on a target film; and etching or sputtering the organic film and the silicon-containing film under a condition in which a selectivity thereof is about 1:1.

According to the exemplary embodiment, it is possible to suppress the etching shape from having the non-uniform pattern.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A and FIG. 1B are diagrams illustrating an example of a substrate processing apparatus according to an exemplary embodiment;

FIG. 5A to FIG. 5D are diagrams illustrating an example of an experiment upon temperature dependency of burial of an organic film according to the first exemplary embodiment;

DETAILED DESCRIPTION

Figure 2A:
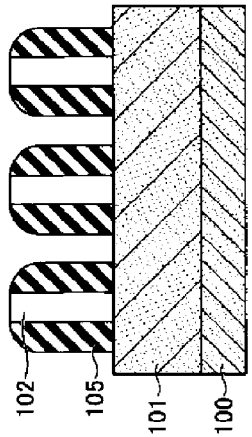
FIG. 2A to FIG. 2F are diagrams for describing a conventional side wall transfer process.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described in detail with reference to the accompanying drawings. In the specification and the drawings, substantially same components will be assigned same reference numerals and redundant description thereof will be omitted

[Substrate Processing Apparatus]

First, a substrate processing apparatus 10 according to an exemplary embodiment will be described with reference to FIG. 1A and FIG. 1B. FIG. 1A and FIG. 1B are schematic diagrams illustrating a parallel plate type CCP (Capacitively Coupled Plasma) plasma processing apparatus as an example of the substrate processing apparatus 10 according to the exemplary embodiment.

First, a configuration of the substrate processing apparatus 10 shown in FIG. 1A will be explained. The substrate processing apparatus 10 includes a processing vessel 11 and a placing table 12 placed therein. The processing vessel 11 is a cylindrical vacuum vessel made of, by way of non-limiting example, aluminum having an alumite-treated (anodically oxidized) surface. The processing vessel 11 is grounded. The placing table 12 includes a base 27 and an electrostatic chuck 13 placed on the base 27. The placing table 12 is disposed at a bottom of the processing vessel 11 with an insulating holder 14 therebetween.

The placing table 12 has the base 27 and the electrostatic chuck 13. The base 27 is formed of aluminum or the like. The electrostatic chuck 13 is made of a dielectric material such as alumina, and is equipped with a mechanism configured to hold a wafer W by an electrostatic attracting force. An edge ring 15 is disposed on a periphery of the electrostatic chuck 13 near the wafer W to surround the wafer W in a ring shape.

A ring-shaped exhaust path 23 is formed between a sidewall of the processing vessel 11 and a sidewall of the placing table 12. The exhaust path 23 is connected to an exhaust device 22. The exhaust device 22 is composed of a vacuum pump such as a turbo molecular pump or a dry pump, and is configured to decompress a processing space within the processing vessel 11 to a predetermined vacuum level and exhaust a gas within the processing vessel 11 through the exhaust path 23 and an exhaust port 24. A baffle plate 21 configured to control a gas flow is provided at an upper portion or an inlet of the exhaust path 23 to separate the processing space from an exhaust space.

A first high frequency power supply 17 and a second high frequency power supply 18 are connected to the placing table 12. The first high frequency power supply 17 applies a high frequency (HF) power of, e.g., 100 MHz for plasma generation to the placing table 12. The second high frequency power supply 18 applies a high frequency (LF) power of, e.g., 40 MHz for bias attraction to the placing table 12. Accordingly, the placing table 12 also serves as a lower electrode.

A gas shower head 16 is provided at a ceiling of the processing vessel 11. The gas shower head 16 also serves as an upper electrode of a ground potential. The high frequency (HF) power for plasma generation from the first high frequency power supply 17 is capacitively applied between the placing table 12 and the gas shower head 16.

A gas supply source 19 is configured to supply a gas according to processing conditions for respective processes such as an etching process, a film forming process, an aching process, and so forth. The gas from a gas line 20 is introduced into the gas shower head 16 through a gas inlet, and is then supplied into the processing vessel 11 in a shower shape from a multiple number of gas holes 26 after passing through a gas diffusion space 25.

The substrate processing apparatus 10 according to the exemplary embodiment shown in FIG. 1B has the substantially same configuration as that of the substrate processing apparatus 10 according to the exemplary embodiment shown in FIG. 1A except that the placement of the first high frequency power supply 17 is different. That is, in the substrate processing apparatus 10 of FIG. 1B, the first high frequency power supply 17 is connected to the gas shower head 16. The first high frequency power supply 17 applies a high frequency (HF) power of, e.g., 60 MHz for plasma generation.

The controller 30 has a CPU, a ROM (Read Only Memory) and a RAM (Random Access Memory) which are not illustrated. The controller 30 controls the processes such as etching and film formation and an overall operation of the apparatus according to a sequence set in a recipe stored in the RAM or the like.

To perform a plasma process in the substrate processing apparatus 10 having the above-described configuration, the wafer W is carried into the processing vessel 11 through a non-illustrated gate valve while being held on a transfer arm. The wafer W is then placed on the electrostatic chuck 13. The gate valve is closed after the wafer W is carried in. By applying a DC voltage to an electrode of the electrostatic chuck 13, the wafer W is attracted to and held on the electrostatic chuck 13 by a Coulomb force.

The processing vessel 11 is decompressed by the exhaust device 22 to a predetermined set value, and the inside of the processing vessel 11 is regulated to be in a vacuum state. A preset gas is supplied from the gas shower head 16 into the processing vessel 11 in a shower shape. The high frequency (HF) power and the high frequency (LF) power are applied to the placing table 12.

Plasma is formed from the introduced gas mainly by the high frequency (HF) power, and a processing such as etching or film formation is performed on the wafer W by the plasma. Upon the completion of all processes required, the wafer W is carried out from the processing vessel 11 while being held on the transfer arm. By repeating this processing, wafers W are processed continually.

[Conventional Substrate Processing Method]

Now, a side wall transfer (SWT) process as an example of a conventional substrate processing method will be described with reference to FIG. 2A to FIG. 2F. FIG. 2A to FIG. 2F are diagrams for describing an example of the conventional side wall transfer.

As shown in FIG. 2A which illustrates an example of a stacked structure, a polysilicon film 101 as an example of an etching target film is formed on a silicon substrate 100. On the polysilicon film 101, a pattern of a photoresist 102 is formed by a photolithography technique. In the following processing, patterning is performed at a pitch smaller than a pitch of the pattern of the photoresist 102.

Figure 2B:
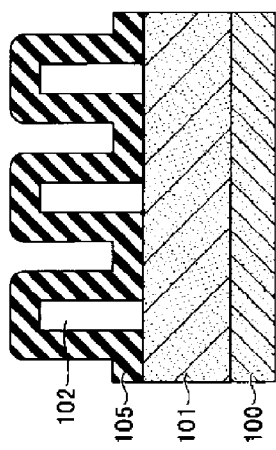
Figure 2C:
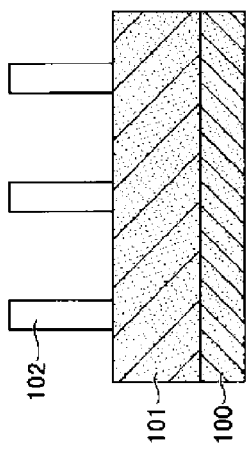

On the photoresist 102 having this stacked structure, a silicon oxide film ($SiO_2$) 105 is formed, as illustrated in FIG. 2B. Then, as depicted in FIG. 2C, the silicon oxide film 105 is etched such that the silicon oxide film 105 is left only on the sidewall of the pattern of the photoresist 102.

Figure 2D:
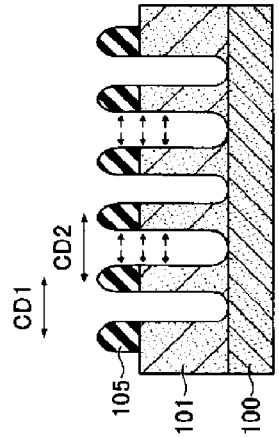
Figure 2E:
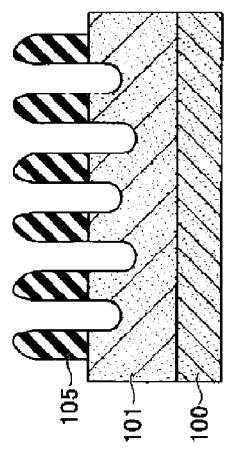
Figure 2F:
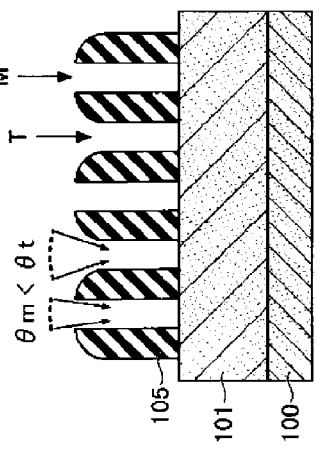

Thereafter, as shown in FIG. 2D, by removing the pattern of the photoresist 102 by aching with oxygen plasma formed from an $O_2$ gas, a pattern by the silicon oxide film 105 remaining on the sidewall is formed. Then, as shown in FIG. 2E and FIG. 2F, the underlying polysilicon film 101 is etched by using the pattern of the silicon oxide film 105 as a mask. Through this method, a fine pattern can be formed on the target film.

As depicted in FIG. 2D, however, the pattern by the silicon oxide film 105 has a so-called claw shape (with one side of an upper end thereof gently curved) whose top surface of this pattern is not flattened. Due to this difference of the shapes of the top surfaces, an ion incident angle $\theta t$ into a recess surrounded by the silicon oxide film 105, which is marked by T, is larger than an ion incident angle $\theta m$ into the recess surrounded by the silicon oxide film 105, which is marked by M.

As a result, as depicted in FIG. 2E, the recess T having the larger incident angle $\theta t$ is more etched than the recess M having the smaller incident angle $\theta m$. Accordingly, an etching shape of the polysilicon film 101 shown in FIG. 2F has a narrow portion CD1 and a wide portion CD2 which are arranged alternately. That is, a so-called non-uniform pattern is formed in the etching shape of the target film.

In this regard, a substrate processing method according to an exemplary embodiment provides a patterning technique capable of suppressing the non-uniform pattern from formed in the etching shape of the target. In the following, a substrate processing method using a burial technique of "Gap fill" according to a first exemplary embodiment and a substrate processing method using the burial technique of "SOC (Spin On Court)" according to a second exemplary embodiment will be explained.

[Substrate Processing Method According to First Exemplary Embodiment]

Figure 3:
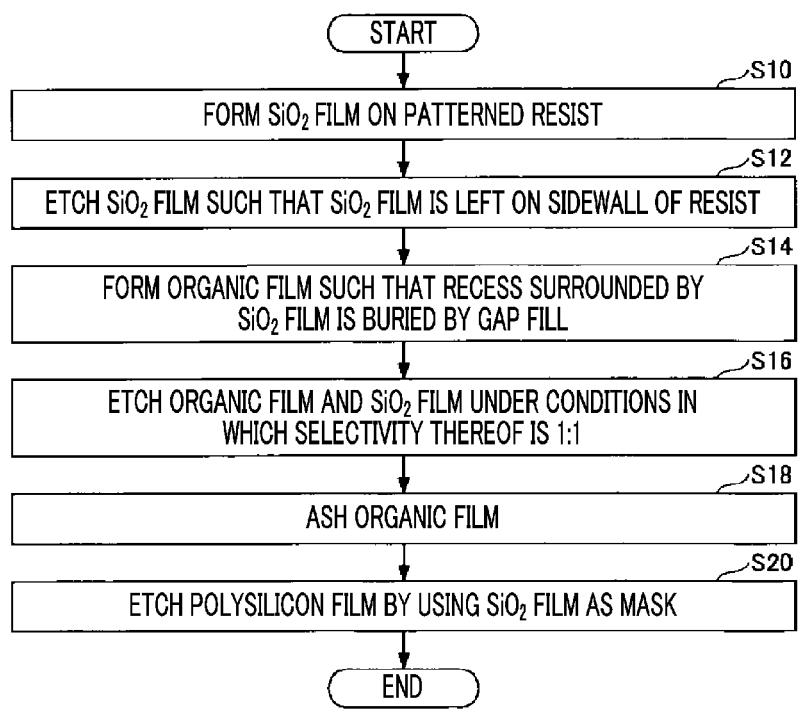
FIG. 3 is a flowchart illustrating an example of a substrate processing method according to a first exemplary embodiment.

First, the substrate processing method according to the first exemplary embodiment will be discussed with reference to FIG. 3 and FIG. 4A to FIG. 4F. FIG. 3 is a flowchart illustrating an example of the substrate processing method according to the first exemplary embodiment. FIG. 4A to FIG. 4F are diagrams illustrating the example of the substrate processing method according to the first exemplary embodiment. A processing of FIG. 3 is controlled by the controller 30.

In the first exemplary embodiment and a second exemplary embodiment, a stacked structure of a film used here is the same as the stacked structure shown in FIG. 2A. That is, the polysilicon film 101 as an example of the target film is formed on the silicon substrate 100, and the photoresist 102 is formed on the polysilicon film 101.

(1) First Process (Formation of Silicon Oxide Film)

Figure 4A:
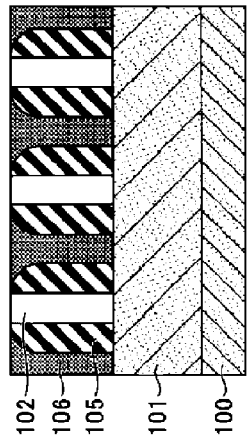
FIG. 4A to FIG. 4F are diagrams illustrating the example of the substrate processing method according to the first exemplary embodiment.

In the first exemplary embodiment, with regard to the film having this stacked structure, the silicon oxide film 105 is formed on the pattern of the photoresist 102 in a process S10 of FIG. 3 (first process). FIG. 4A illustrates a state in which the silicon oxide film 105 is formed on the pattern of the photoresist 102 on the polysilicon film 101.

Either of an ALD (Atomic layer deposition) apparatus or a CVD (Chemical Vapor Deposition) apparatus may be used for the formation of the silicon oxide film 105 as long as, desirably, the silicon oxide film 105 is conformally formed on the pattern of the photoresist 102. By way of example, an example of forming the silicon oxide film 105 by using the ALD apparatus will be explained below. In the film formation by the ALD apparatus, the silicon oxide film 105 is formed by repeating four processes including formation of plasma of a first gas→purge→formation of plasma of a second gas→purge.

The first gas is a silicon halide gas and includes, for example, a $SiCl_4$ gas. Further, the first gas may further include a rare gas such as an Ar gas or a He gas. Furthermore, the first gas may include a $SiBr_4$ gas, a $SiF_4$ gas or a $SiH_2Cl_4$ gas as the silicon halide gas.

If the plasma of the first gas is formed as the high frequency (HF) power is supplied from the first high frequency power supply 17, a reactant precursor such as dissociated species of the silicon halide contained in the first gas is generated. The generated precursor adheres to the photoresist 102 and the polysilicon film 101.

Instead of the silicon halide gas, an aminosilane-based gas or a silicon alkoxide-based gas may be used as the first gas. The aminosilane-based gas includes monoaminosilane such as, but not limited to, BTBAS (bis(tertiary-butyl-amino) silane) or BDMAS(bis(dimethyl-amino)silane), and the silicon alkoxide-based gas includes, by way of non-limiting example, TEOS (tetraethoxysilane).

Further, if the aminosilane-based gas having high reactivity is used as the first gas, this gas dissociates on the surfaces of the photoresist 102 and the polysilicon film 101 even in the gas state to form the reactant precursor. Thus, it is not needed to form the plasma of the first gas by supplying the high frequency (HF) power from the first high frequency power supply 17.

Subsequently, a space within the processing vessel 11 is purged, and the first gas is exhausted. As the purge gas, an inert gas such as a nitrogen gas may be supplied into the processing vessel 11. That is, either a gas purge of allowing the inert gas to be flown in the processing vessel 11 or a purge by the vacuum-evacuation may be performed.

Thereafter, the second gas containing an oxygen gas is supplied. If plasma of the second gas is formed as the high frequency (HF) power is supplied from the first high frequency power supply 17, active species of oxygen, for example, oxygen radicals are generated, so that silicon contained in the precursor is oxidized. As a result, the silicon oxide film 105 is formed on the wafer W.

Then, the space within the processing vessel 11 is purged, and the second gas is exhausted. By repeating the above-described four processes, the silicon oxide film 105 is formed on the photoresist 102, as illustrated in FIG. 4A.

In the above, the film forming process using the ALD apparatus has been described. However, the exemplary embodiment is not limited thereto. In the first process, the silicon oxide film 105 may be formed by the CVD while using the substrate processing apparatus 10 instead of using the ALD apparatus.

Further, the silicon oxide film 105 is an example of a silicon-containing film formed on the photoresist 102. As the silicon-containing film, a silicon nitride (SiN) film, a SiON film, or the like may be formed instead of the silicon oxide film.

Moreover, the target film is not limited to the polysilicon film 101 and may be a single crystalline silicon film, a silicon nitride film or a metal film. If the silicon nitride film is formed on the photoresist 102, it is possible to etch the silicon oxide film, instead of the polysilicon film 101, as a target film.

(2) Second Process (Etching of Silicon Oxide Film)

Referring back to FIG. 3, in a subsequent process S12, the silicon oxide film 105 is etched such that it is left on the sidewall of the pattern of the photoresist 102 (second process). The second process is performed by using the substrate processing apparatus 10 under the following processing conditions.

Figure 4B:
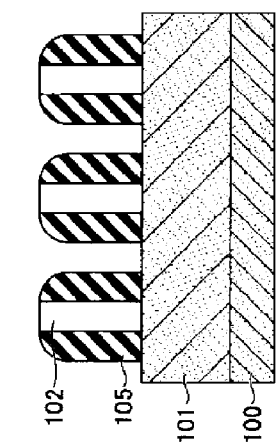

<Processing Conditions for Second Process>
Pressure within processing vessel: 20 mT (about 2.66 Pa)
High frequency (HF) power: 200 W
High frequency (LF) power: 100 W
Temperature of placing table: 80° C.
Gases (gas flow rates): $C_4F_8$, $O_2$, Ar Accordingly, as shown in FIG. 4B, the silicon oxide film 105 is left on the sidewall of the photoresist 102, so that a recess surrounded by in the silicon oxide film 105 is formed.

(3) Third Process (Burial)

Referring back to FIG. 3, in a subsequent process S14, an organic film 106 is formed to be buried in the recess surrounded by the silicon oxide film 105 (third process). The third process is performed by using the substrate processing apparatus 10 under the following processing conditions.

<Processing Conditions for Third Process>
Pressure within processing vessel: 50 mT (about 6.65 Pa)
High frequency (HF) power: 300 W
High frequency (LF) power: 0 W
Gas (gas flow rate): $C_4F_8$
Temperature of placing table: −60° C.

Figure 4C:
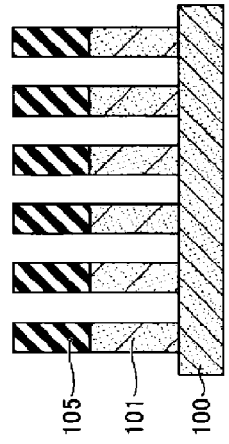

As a result, the organic film 106 is buried in the recess surrounded by the silicon oxide film 105, as depicted in FIG. 4C.

In the burial of the organic film 106 by the Gap fill under these processing conditions, a precursor in plasma formed from the $C_4F_8$ gas is deposited in the recess surrounded by the silicon oxide film 105 to be formed in a bottom-up manner. Thus, a void which is a space in the buried film may not be generated. The organic film 106 formed by the film forming method according to the present exemplary embodiment may be referred to as a fluidic organic film. That is, under the above-specified processing conditions, the fluidic organic film can be buried in the recess surrounded by the silicon oxide film 105 as the organic film 106 without causing the generation of the void.

Here, it is not desirable that the entire top surface of the silicon oxide film 105 is exposed. Meanwhile, it is desirable that, by completely burying the organic film 106 in the recess surrounded by the silicon oxide films 105, the top surface of the silicon oxide film 105 is covered with the thin organic film 106 or a part of the top surface of the silicon oxide film 105 is exposed.

Temperature dependency in the third process will be discussed with reference to FIG. 5A to FIG. 5D. FIG. 5A to FIG. 5D are diagrams illustrating an example of a result of an experiment conducted to investigate the temperature dependency of the burial of the organic film 106 according to the first exemplary embodiment. The experiment is conducted under the following processing conditions.

<Processing Conditions for Experiment of FIG. 5A to FIG. 5D>

Pressure within processing vessel: 50 mT (about 6.65 Pa) or 100 mT (about 13.3 Pa)

High frequency (HF) power: 300 W

High frequency (LF) power: 0 W

Gas (gas flow rate): $C_4F_6$ or IPA (isopropyl alcohol: $C_3H_8O$)

Temperature of placing table: −10° C., −20° C., −30° C., −40° C., −50° C.

To elaborate, FIG. 5A illustrates states of the organic film at respective temperatures when the inside of the processing vessel 11 is maintained at a pressure of 100 mT and a $C_4F_6$ gas is supplied at a flow rate of 300 sccm. A void V is observed at the temperatures of −10° C. and −20° C. Meanwhile, at the temperatures of −30° C. and −50° C., an organic film R is formed to be stacked from a bottom of a recess thereof, so that no void V is formed and the inside of the recess is filled with the fluidic organic film R. Further, at the temperature of −40° C., no result is obtained.

FIG. 5B illustrates states of the organic film at the respective temperatures when the inside of the processing vessel 11 is maintained at a pressure of 50 mT and an IPA (isopropyl alcohol) gas is supplied at a flow rate of 75 sccm. The IPA is one kind of secondary alcohol. At the temperatures of −10° C. and −30° C., the void V is formed, and isotropic film formation is conducted. Meanwhile, at the temperatures of −40° C. and −50° C., no void V is formed, and the recess is filled with the fluidic organic film R. Further, at the temperatures of −20° C., no result is obtained.

FIG. 5C illustrates states of the organic film at the respective temperatures when the inside of the processing vessel 11 is maintained at the pressure of 50 mT and the $C_4F_6$ gas is supplied at a flow rate of 300 sccm. At the temperature of −10° C., the void V is formed, whereas at the temperatures of −20° C., −30° C., and −50° C., no void V is formed, and the recess is filled with the fluidic organic film R. Further, at the temperatures of −40° C., no result is obtained.

FIG. 5D illustrates states of the organic film at the respective temperatures when the inside of the processing vessel 11 is maintained at the pressure of 50 mT and the $C_4F_6$ gas is supplied at a flow rate of 125 sccm. At the temperature of −10° C. and −20° C., the void V is formed, whereas at the temperature of −30° C., no void V is formed, and the recess is filled with the fluidic organic film R. Further, at the temperatures of −40° C. and −50° C., no result is obtained.

As can be seen from the above, the temperatures at which the recess can be filled with the fluidic organic film R are different depending on the kind of the gas, the pressure and the gas flow rate. At least, when the inside of the processing vessel 11 is maintained at 50 mT and the $C_4F_6$ gas is supplied at the flow rate of 300 sccm, the recess can be filled with the fluidic organic film R at an extremely low temperature equal to or less than −20° C.

Referring to the processing conditions of the third process in which the organic film 106 is formed by supplying the $C_4F_8$ gas, it is desirable to supply a gas containing at least any one of the $C_4F_6$ gas, the $C_3H_8O$ gas or the $C_4F_8$ gas and cool the placing table 12 to an extremely low temperature ranging from −20° C. to −60° C.

Further, the $C_4F_6$ gas, the $C_3H_8O$ gas and the $C_4F_8$ gas are materials each having a low vapor pressure. In view of the fact that the $C_4F_8$ gas reaches a vapor pressure at the lowest temperature under the same pressure, it is desirable to use, as a gas used in the third process, a gas which reaches a vapor pressure at a temperature equal to or higher than a temperature indicated by a vapor pressure curve of the $C_4F_8$ gas. Further, to deposit the organic film 106, it is desirable that this gas is a carbon-containing gas.

(4) Fourth Process (Flattening)

Referring back to FIG. 3, in a subsequent process S16, the organic film 106 and the silicon oxide film 105 are etched under conditions in which a selectivity thereof is approximately 1:1 (fourth process). The fourth process is performed by using the substrate processing apparatus 10 under the following processing conditions.

<Processing Conditions for Fourth Process>

Pressure within processing vessel: 10 mT (about 1.33 Pa)

High frequency (HF) power: 0 W

High frequency (LF) power: 500 W

Gas (gas flow rate): $CF_4/O_2/Ar$ or $CF_4/O_2$

Temperature of placing table: −60° C.

Figure 4D:
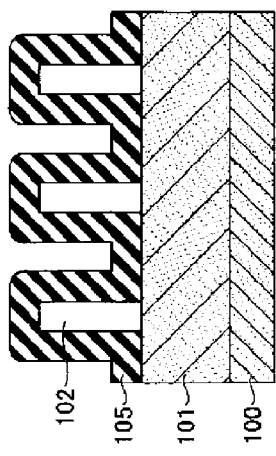

Accordingly, as depicted in FIG. 4D, the organic film 106 and the silicon oxide film 105 are etched under the conditions in which the selectivity thereof is approximately 1:1, so that the top surfaces of the organic film 106 and the silicon oxide film 105 are flattened.

In the fourth process, the organic film 106 and the silicon oxide film 105 are etched with a gas containing Ar, $CF_4$ and $O_2$ or a gas containing $CF_4$ and $O_2$. Accordingly, the selectivity of the organic film 106 and the silicon oxide film 105 can be made to be 1:1 by controlling the etching rates of the organic film 106 and the silicon oxide film 105 to be substantially same. The aforementioned condition of the gas is included in the conditions that allow the selectivity of the organic film 106 and the silicon oxide film 105 to be 1:1.

Further, in the fourth process, the organic film 106 and the silicon oxide film 105 may be sputtered with a rare gas such as, by way of example, an Ar gas. In this case, the fourth process is performed by using the substrate processing apparatus 10 under the following processing conditions.

<Processing conditions for fourth process of another example>
  Pressure within processing vessel: 10 mT (about 1.33 Pa)
  High frequency (HF) power: 0 W
  High frequency (LF) power: 500 W
  Gas (gas flow rate): Ar
  Temperature of placing table: −60° C.

Accordingly, by controlling the sputtering rates of the organic film 106 and the silicon oxide film 105 to be substantially same, the selectivity of the organic film 106 and the silicon oxide film 105 can be set to be 1:1. The aforementioned condition of the gas is included in the conditions under which the selectivity of the organic film 106 and the silicon oxide film 105 are set to be 1:1.

Further, after the fourth process and before the fifth process, a process of removing a residue left on the surfaces of the organic film 106 and the silicon oxide film 105 may be further performed. In such a case, the process of removing the residue is performed under the following processing conditions in which the selectivity of the organic film 106 and the silicon oxide film 105 is set to be approximately 1:1.
  Pressure within processing vessel: 50 mT (about 6.65 Pa)
  High frequency (HF) power: 300 W
  High frequency (LF) power: 300 W
  Gases (gas flow rates): $CF_4$, $O_2$
  Temperature of placing table: −60° C.

Accordingly, the residue remaining on the surfaces of the organic film 106 and the silicon oxide film 105 can be removed. However, this processing can be omitted.

(5) Fifth Process (Aching)

Referring back to FIG. 3, in a subsequent process S18, the organic film 106 is ached to be removed (fifth process). The fifth process is performed by using the substrate processing apparatus 10 after switching to processing conditions under which the selectivity of the organic film 106 and the silicon oxide film 105 is set to be sufficiently large.
  <Processing Conditions for Fifth Process>
  Pressure within processing vessel: 50 mT (about 6.65 Pa)
  High frequency (HF) power: 500 W
  High frequency (LF) power: 50 W
  Gas (gas flow rate): $O_2$
  Temperature of placing table: −60° C.

Figure 4E:
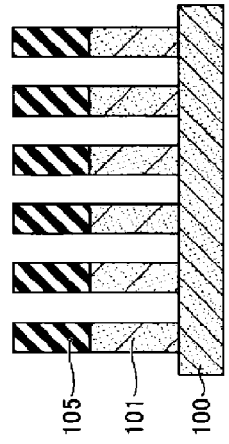

Accordingly, the organic film 106 is removed, as shown in FIG. 4E.

(6) Sixth Process (Etching of Target Film)

Figure 4F:
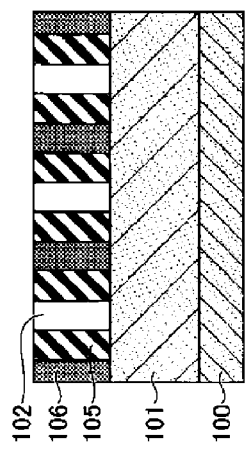

Referring back to FIG. 3, in a subsequent process S20, the polysilicon film 101 is etched by using the silicon oxide film 105 as a mask (sixth process), and then, the present processing is ended. The sixth process is performed by using the substrate processing apparatus 10. Accordingly, as depicted in FIG. 4F, the fine pattern having the uniform etching shape can be formed on the polysilicon film 101.

As stated above, in the substrate processing method according to the first exemplary embodiment, the pattern of the silicon oxide film 105 having the finer pitch than the pattern of the photoresist 102 is formed through the first process to the sixth process. Therefore, by etching the polysilicon film 101 with the silicon oxide film 105 as a mask, the polysilicon film 101 can be micro-processed.

Furthermore, in the substrate processing method according to the first exemplary embodiment, the top surfaces of the organic film 106 and the silicon oxide film 105 are flattened. Accordingly, the top surface of the silicon oxide film 105 after the organic film 106 is removed in the fifth process is not curved but flattened. As a result, when the polysilicon film 101 is etched by using the silicon oxide film 105 as the mask, the etching shape can be suppressed from having non-uniform pattern. Therefore, the fine pattern having the uniform etching shape can be formed on the polysilicon film 101.

In the burial of the organic film 106 according to the first exemplary embodiment, the organic film 106 can be buried even in case that the size of the recess surrounded by the silicon oxide film 105 is equal to or less than 20 nm. Accordingly, if the size of the recess surrounded by the silicon oxide film 105 is equal to or less than 20 nm, it is desirable to use this technique of burying the organic film 106 according to the first exemplary embodiment.

[Substrate Processing Method According to Second Exemplary Embodiment]

Figure 6:
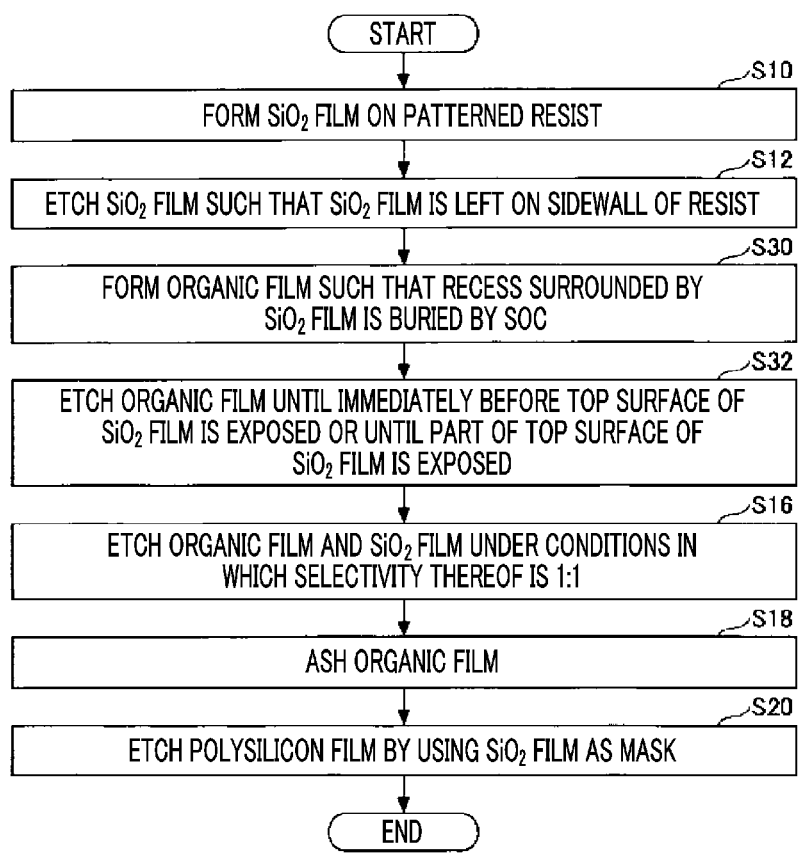
FIG. 6 is a flowchart illustrating an example of a substrate processing method according to a second exemplary embodiment.

Now, a substrate processing method according to a second exemplary embodiment will be described with reference to FIG. 6 and FIG. 7A to FIG. 7F. FIG. 6 is a flowchart illustrating an example of the substrate processing method according to the second exemplary embodiment. FIG. 7A to FIG. 7F are diagrams illustrating the example of the substrate processing method according to the second exemplary embodiment. A processing of FIG. 6 is controlled by the controller 30.

Figure 7A:
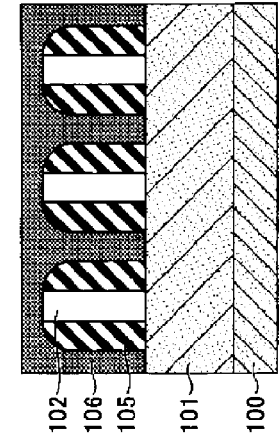
FIG. 7A to FIG. 7F are diagrams illustrating the example of the substrate processing method according to the second exemplary embodiment.

In the substrate processing method according to the second exemplary embodiment, a first process (formation of silicon oxide film) of FIG. 6 (process S10) and FIG. 7A is the same as the first process of FIG. 3 (process S10) and FIG. 4A.

Figure 7B:
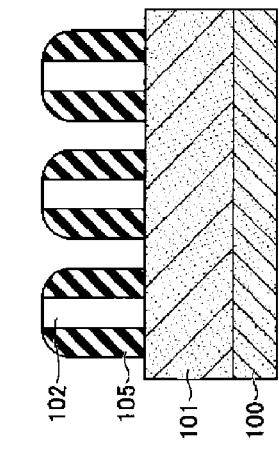
Figure 7D:
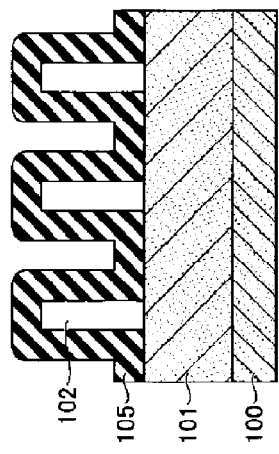

Further, a second process (etching of silicon oxide film) of FIG. 6 (process S12) and FIG. 7B is the same as the second process of FIG. 3 (process S12) and FIG. 4B. Further, a fourth process (flattening) of FIG. 6 (process S16) and FIG. 7E is the same as the fourth process of FIG. 3 (process S16) and FIG. 4D.

Figure 7C:
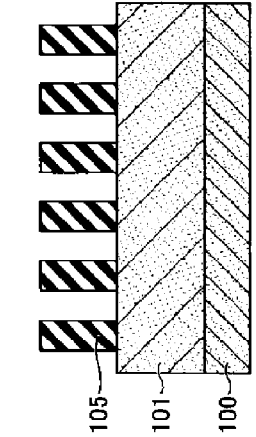
Figure 7E:
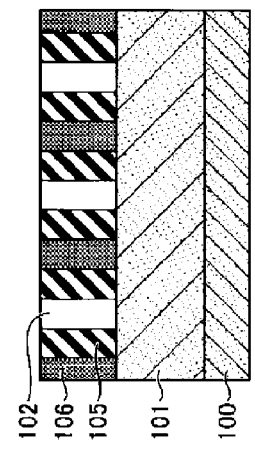
Figure 7F:
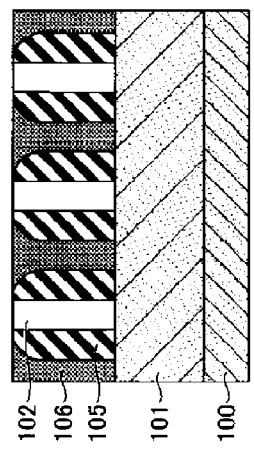

Moreover, a fifth process (aching) of FIG. 6 (process S18) and FIG. 7F is the same as the fifth process of FIG. 3 (process S18) and FIG. 4E. Further, a sixth process (etching of target film) of FIG. 6 (process S20) is the same as the sixth process of FIG. 3 (process S20) and FIG. 4F.

Thus, redundant description of these same processes will be omitted, and a third process (burial) of FIG. 6 (process S30) and FIG. 7C and a 3-1 process (etch-back) of FIG. 6 (process S32) and FIG. 7D will be explained below.

(3) Third Process (Burial)

As depicted in FIG. 6 (process S30) and FIG. 7C, the burial of the organic film 106 in the third process according to the second exemplary embodiment is carried out by coating an organic material through the SOC (Spin On Court) by using a film forming apparatus such as a coater/developer. In the SOC, a chemical liquid containing an organic acid is supplied from a nozzle provided at the coater/developer as an organic material. The chemical liquid supplied onto the wafer W is diffused on a main surface of the wafer W by a centrifugal force generated by the rotation of the wafer W. Then, as a volatile component of the chemical liquid is volatilized by the rotation of the wafer W and a subsequent heating processing through baking, the chemical liquid is solidified or hardened. As a result, as depicted in FIG. 7C, the organic film 106 is formed in the recess surrounded by the silicon oxide film 105 and on the silicon oxide film 105 and the photoresist 102.

(4) 3-1 Process (Etch-Back)

Subsequently, as shown in FIG. 6 (process S32) and FIG. 7D, etch-back of the organic film 106 as the 3-1 process is performed after the third process. That is, in the substrate processing method according to the second exemplary embodiment, the organic film 106 is etched-back until immediately before the top surface of the silicon oxide film 105 is exposed or until a part of the top surface of the silicon oxide film 105 is exposed.

Further, in the substrate processing apparatus according to the first exemplary embodiment, the 3-1 process (etch-back) may be performed after the third process (burial) by the Gap fill, when necessary. The 3-1 process is performed by using the substrate processing apparatus 10 under the following processing conditions.

<Processing Conditions for 3-1 Process>
Pressure within processing vessel: 70 mT (about 9.33 Pa)
High frequency (HF) power: 100 W
High frequency (LF) power: 100 W
Temperature of placing table: 80° C.
Gases (gas flow rates): $C_4F_8$, $O_2$, Ar In the substrate processing method according to the second exemplary embodiment, the first process, the second process, the third process, the 3-1 process, the fourth process, the fifth process and the sixth process are performed in this sequence.

According to the substrate processing method of the second exemplary embodiment as well, the pattern of the silicon oxide film 105 having the finer pitch than that of the pattern of the photoresist 102 is formed through these seven processes. Accordingly, the polysilicon film 101 can be micro-processed by etching the polysilicon film 101 with the silicon oxide film 105 as the mask.

Further, in the present exemplary embodiment as well, the top surfaces of the organic film 106 and the silicon oxide film 105 are flattened in the fourth process. As a result, when etching the polysilicon film 101 with the silicon oxide film 105 as the mask, the etching shape can be suppressed from having non-uniform pattern. Therefore, the fine pattern with the uniform etching shape can be formed on the polysilicon film 101.

Furthermore, the substrate processing methods according to the first exemplary embodiment and the second exemplary embodiment may be applicable to any of SADP, SAQP and SWT techniques.

[Processings in Same Processing Vessel]

In the substrate processing method according to the first exemplary embodiment, at least the second process of forming the recess surrounded by the silicon oxide film 105 on the sidewalls of the photoresist 102 and the third process of burying the organic film 106 in the recess may be performed in the same processing vessel 11. Accordingly, it is desirable that at least the second process and the third process are performed by transferring the wafer W in the same processing vessel or the same transfer system under the vacuum environment. If the wafer W is exposed to the atmosphere before the third process and after the second process, a halogen-based (fluorine or chlorine) reaction product attached to the wafer W in the second process may react with moisture or oxygen in the atmosphere, so that the particle generation may easily occur.

Further, in the substrate processing apparatus according to the first exemplary embodiment, all of the first process to the sixth process (may include the 3-1 process) can be performed in the same processing vessel 11 of the substrate processing apparatus 10. Accordingly, a time required to transfer the wafer W into another processing vessel is saved, so that the productivity can be improved.

In addition, by transferring the wafer W in the same processing vessel or the same transfer system under the vacuum environment, the particle generation can be reduced. Further, by reducing the particle generation through the transferring of the wafer W in the same processing vessel or the same transfer system under the vacuum environment, management of a time limit (Q-time) set as an exposure time from one process which is previously performed to a next process and wet cleaning of F or C adhering to the surface of the wafer W may not be required.

Moreover, in the substrate processing method according to the second exemplary embodiment, the second process and the third process of burying the organic film 106 through the SOC are performed in different processing vessels.

The substrate processing method and the substrate processing apparatus according to the exemplary embodiments are not meant to be anyway limiting. The exemplary embodiments can be changed and modified in various ways without departing from the scope of the present disclosure as claimed in the following claims. Unless contradictory, the disclosures in the various exemplary embodiments can be combined appropriately.

The substrate processing apparatus may be applicable to any of various types such as capacitively coupled plasma (CCP), inductively coupled plasma (ICP), radial line slot antenna, electron cyclotron resonance plasma (ECR) and helicon wave plasma (HWP).

In the present disclosure, the wafer W is described as the example of the substrate. However, the substrate is not limited thereto and may be any of various substrates used in a LCD (Liquid Crystal Display) and a FPD (Flat Panel Display), a CD substrate, a print substrate, or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing method, comprising:
    burying an organic film in a recess surrounded by a silicon-containing film formed on a sidewall of a pattern of photoresist on a target film; and
    etching or sputtering the organic film and the silicon-containing film under a condition in which a selectivity thereof is about 1:1.

2. The substrate processing method of claim 1,
    wherein the burying of the organic film comprises:
    placing a substrate, which has the target film formed thereon, on a placing table cooled to a temperature equal to or less than 20° C. within a vacuum processing vessel;
    supplying a gas into the processing vessel;
    forming plasma from the supplied gas; and
    burying, in the recess, a precursor by the plasma.

3. The substrate processing method of claim 2,
    wherein, in the placing of the substrate on the placing table, the substrate is placed on the placing table cooled to the temperature ranging from −60° C. to −20° C.

4. The substrate processing method of claim 1,
    wherein, in the burying of the organic film, the organic film is buried in the recess by coating an organic material by spinning a substrates.

5. The substrate processing method of claim 1, further comprising:

etching the organic film until immediately before a top surface of the silicon-containing film is exposed or until a part of the top surface of the silicon-containing film is exposed, wherein the etching of the organic film is performed between the burying of the organic film and the etching of the organic film and the silicon-containing film.

6. The substrate processing method of claim 1, wherein the condition in which the selectivity is set to be about 1:1 includes a condition in which the organic film and the silicon-containing film are etched by using a gas containing Ar, $CF_4$ and $O_2$ or by using a gas containing $CF_4$ and $O_2$.

7. The substrate processing method of claim 1, wherein the condition in which the selectivity is set to be about 1:1 includes a condition in which the organic film and the silicon-containing film are sputtered by using a rare gas.

8. The substrate processing method of claim 1, wherein forming of the recess surrounded by the silicon-containing film on the sidewall of the photoresist by etching the silicon-containing film and the burying of the organic film in the recess surrounded by the silicon-containing film are performed in a single processing vessel.

9. The substrate processing method of claim 1, wherein forming of the recess surrounded by the silicon-containing film on the sidewall of the photoresist by etching the silicon-containing film and the burying of the organic film in the recess surrounded by the silicon-containing film are respectively performed in different processing vessels.

10. A substrate processing method, comprising:

forming a silicon-containing film on a pattern of photoresist formed on a target film;

forming a recess surrounded by the silicon-containing film on a sidewall of the photoresist by etching the silicon-containing film;

burying an organic film in the recess surrounded by the silicon-containing film;

etching the organic film and the silicon-containing film under a condition in which a selectivity thereof is about 1:1; and removing the organic film, wherein the forming of the silicon-containing film, the forming of the recess, the burying of the organic film, the etching of the organic film and the silicon-containing film and the removing of the organic film are all performed in a single processing vessel.

* * * * *

UNITED STATES PATENT AND TRADEMARK OFFICE
CERTIFICATE OF CORRECTION

PATENT NO. : 10,886,138 B2
APPLICATION NO. : 16/416424
DATED : January 5, 2021
INVENTOR(S) : Timothy Tianshyun Yang et al.

It is certified that error appears in the above-identified patent and that said Letters Patent is hereby corrected as shown below:

In the Specification

Column 3, Line 49, "aching" should be -- ashing --.

Column 4, Line 47, "aching" should be -- ashing --.

Column 9, Line 30, "(Aching)" should be -- (Ashing) --.

Column 9, Line 32, "ached" should be -- ashed --.

Column 10, Line 35, "(aching)" should be -- (ashing) --.

Signed and Sealed this
Seventh Day of September, 2021

Drew Hirshfeld
*Performing the Functions and Duties of the
Under Secretary of Commerce for Intellectual Property and
Director of the United States Patent and Trademark Office*